(12) United States Patent
Goo et al.

(10) Patent No.: US 8,818,785 B2
(45) Date of Patent: *Aug. 26, 2014

(54) METHOD AND APPARATUS FOR SIMULATING GATE CAPACITANCE OF A TUCKED TRANSISTOR DEVICE

(75) Inventors: Jung-Suk Goo, Los Altos, CA (US); Ciby Thuruthiyil, Fremont, CA (US); Venkat Ramasubramanian, Sunnyvale, CA (US); John Faricelli, Stow, MA (US)

(73) Assignees: GLOBALFOUNDRIES Inc., Grand Cayman (KY); Advanced Micro Devices, Inc., Sunnyvale, CA (US)

( * ) Notice: Subject to any disclaimer, the term of this patent is extended or adjusted under 35 U.S.C. 154(b) by 321 days.

This patent is subject to a terminal disclaimer.

(21) Appl. No.: 13/288,541

(22) Filed: Nov. 3, 2011

(65) Prior Publication Data
US 2013/0117001 A1 May 9, 2013

(51) Int. Cl.
G06F 17/50 (2006.01)

(52) U.S. Cl.
CPC .................... *G06F 17/5036* (2013.01)
USPC .......................................................... 703/14

(58) Field of Classification Search
None
See application file for complete search history.

(56) References Cited

U.S. PATENT DOCUMENTS

| 5,555,201 | A  | * | 9/1996  | Dangelo et al. | 716/102 |
| 5,982,008 | A  | * | 11/1999 | Kajiyama       | 257/401 |
| 7,213,221 | B1 | * | 5/2007  | Celik et al.   | 716/113 |
| 7,340,698 | B1 | * | 3/2008  | Srinivasan et al. | 716/113 |
| 7,885,799 | B2 | * | 2/2011  | Huang et al.   | 703/13 |
| 2011/0166847 | A1 | * | 7/2011 | Li et al.     | 703/14 |

OTHER PUBLICATIONS

Liechti, T., "How to Make a Chip" Design Flow and Tool used for the Design of a Pipelined ADC, Ecole Plytechnique Federale De Lausanne, May 30, 2007, [retrieved on Nov. 8, 2013] Retrieved from the Internet http://ece.wpi.edu/analog/resources/HowToMakeAChip_v1.pdf.*

Fischer, B., An Assura geometry extraction and Spectre re-simulation flow to simulate Shallow Trench Isolation (STI) stress effects in analogue circuits, Xignal Technologies AG, Germany, CDNLive! EMEA Nice, France, Jun. 25-27, 2006. [retrieved on Nov. 8, 2013] Retrieved from the Internet http://www.cadence.com/rl/Resources/conference_papers/ctp_cdnli.*

Datasheet, Cadence Assura Layout vs. Schematic (LVS) Verifier, Cadence Design Systems, Inc., 2007 [retrieved on Nov. 8, 2013] Retrieved from the Internet http://www.eda.co.il/WEB/8888/NSF/Web/1214/4903_VirtuosoALVS_DSfnl.pdf.*

(Continued)

*Primary Examiner* — Kamini S Shah
*Assistant Examiner* — Scott S Cook
(74) *Attorney, Agent, or Firm* — Amerson Law Firm, PLLC

(57) ABSTRACT

A method for simulating a tucked transistor device having a diffusion region defined in a semiconductor layer, a gate electrode adjacent a first side of the diffusion region, a floating gate electrode adjacent a second side of the diffusion region, and an isolation structure disposed beneath at least a portion of the floating gate electrode is provided. The method includes receiving a first netlist having an entry for the tucked transistor device in a computing apparatus. The entry defines parameters associated with the gate electrode and the diffusion region. A parasitic capacitance component is added to the entry representing a gate capacitance between the floating gate and the diffusion region in the computing apparatus.

11 Claims, 8 Drawing Sheets

(56) References Cited

OTHER PUBLICATIONS

Cadence Parasitic Simulation User Guide, Product Version 5.0, Cadence Design Systems Inc., Dec. 2002. [retrieved on Nov. 8, 2013] Retrieved from the Internet ftp://ftp.sitsemi.ru/pub/Cadence/parasim.pdf.*

QRC Extraction User Manual, Product Version 8.1.5, Cadence Design Systems Inc., Sep. 2009. [Rectrieved on Nov. 8, 2011] Retrieved from the Internet http://web.mit.edu/fredchen/www/share/qrcxUser.pdf.*

Foty, D.P., MOSFET Modeling with Spice: Principles and Practice. Prentice-Hall, Inc., Upper Saddle River, NJ, USA., 1997.*

Smith, M.J.S., Application-Specific Integrated Circuits. Addison-Wesley Professional; 10th edition, Nov. 2001 [Retrieved on Sep. 23, 2013] Retrieved from the Internet: http://iroi.seu.edu.cn/books/asics/ASICs.htm.*

Nenzi, P., Vogt, H., Ngspice Users Manual. University of California, Version 22, Sep. 25, 2010 [Retrieved Sep. 23, 2013]. Retrieved online: http://ngspice.sourceforge.net/docs.html.*

Cohen-Yashar, E., From Tools to Flow: Linking the chains in Cadence Reference Flow, Tower Semiconductor Ltd, CDNLive, Dec. 2006. [Retreived on Nov. 8, 2013] Retrieved from the Internet https://www.cadence.com/rl/Resources/conference_papers/ctp_cdnlive2006_Israel_towersemi.pdf.*

Chu, M., Commonly used EDA Tool for full custom IC design sorted by Company names[Retrieved on Nov. 8, 2013] Retrieved from the Internet http://pdk101.com/EDA_related/EDA_prime.html.*

* cited by examiner

METHOD AND APPARATUS FOR SIMULATING GATE CAPACITANCE OF A TUCKED TRANSISTOR DEVICE

CROSS-REFERENCE TO RELATED APPLICATIONS

Not applicable.

BACKGROUND

The present subject matter relates generally to semiconductor device manufacturing and, more particularly, to a method and apparatus for simulating gate capacitance of a tucked transistor device.

The fabrication of complex integrated circuits involves the fabrication of a large number of transistor elements, which are used in logic circuits as switching devices. Generally, various process technologies are currently practiced for complex circuitry, such as microprocessors, storage chips, and the like. One process technology currently used is complimentary metal oxide silicon (CMOS) technology, which provides benefits in terms of operating speed, power consumption, and/or cost efficiency. In CMOS circuits, complementary transistors (e.g., p-channel transistors and n-channel transistors) are used for forming circuit elements, such as inverters and other logic gates to design complex circuit assemblies, such as CPUs, storage chips, and the like.

During the fabrication of complex integrated circuits using CMOS technology, millions of transistors are formed on a substrate including a crystalline semiconductor layer. A transistor includes pn-junctions that are formed by an interface of highly doped drain and source regions with an inversely doped channel region disposed between the drain region and the source regions. The conductivity of the channel region, i.e., the drive current capability of the conductive channel, is controlled by a gate electrode formed in the vicinity of the channel region and separated therefrom by a thin insulating layer. A conductive channel is formed when an appropriate control voltage is applied to the gate electrode. The conductivity of the channel region depends on the dopant concentration, the mobility of the majority charge carriers, and—for a given extension of the channel region in the transistor width direction—on the distance between the source and drain regions, which is also referred to as channel length.

Hence, the overall conductivity of the channel region substantially determines an aspect of the performance of the MOS transistors. By reducing the channel length, and accordingly, the channel resistivity, an increase in the operating speed of the integrated circuits may be achieved.

The continuing shrinkage of the transistor dimensions does raise issues that might offset some of the advantages gained by the reduced channel length. For example, highly sophisticated vertical and lateral dopant profiles may be required in the drain and source regions to provide low sheet and contact resistivity in combination with a desired channel controllability. Moreover, the gate dielectric material may also be adapted to the reduced channel length in order to maintain the required channel controllability. However, some mechanisms for obtaining a high channel controllability may also have a negative influence on the charge carrier mobility in the channel region of the transistor, thereby partially offsetting the advantages gained by the reduction of the channel length.

The continuous size reduction of the critical dimensions, i.e., the gate length of the transistors, necessitates the adaptation of current process techniques and possibly the development of new process techniques. One technique for enhancing the channel conductivity of the transistor elements involves increasing the charge carrier mobility in the channel region for a given channel length, thereby offering the potential for achieving a performance improvement that is comparable with the advance to a future technology node while avoiding or at least postponing many of the process adaptations associated with device scaling.

One efficient mechanism for increasing the charge carrier mobility is to modify the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material increases the mobility of electrons, which, in turn, may directly translate into a corresponding increase in the conductivity. On the other hand, compressive strain in the channel region may increase the mobility of holes, thereby providing the potential for enhancing the performance of p-type transistors.

The introduction of stress or strain engineering into integrated circuit fabrication is a promising approach for future device generations. Strained silicon may be considered as a "new" type of semiconductor material that enables the fabrication of fast powerful semiconductor devices without requiring expensive semiconductor materials and also allows the use of many of the well-established current manufacturing techniques.

One technique for inducing stress in the channel region involves introducing, for instance, a silicon/germanium layer next to the channel region so as to induce a compressive stress that may result in a corresponding strain. The transistor performance of p-channel transistors may be considerably enhanced by the introduction of stress-creating layers next to the channel region. For this purpose a strained silicon/germanium layer may be formed in the drain and source regions of the transistors. The compressively strained drain and source regions create uni-axial strain in the adjacent silicon channel region. When forming the Si/Ge layer, the drain and source regions of the PMOS transistors are selectively recessed, while the NMOS transistors are masked. Subsequently, the silicon/germanium layer is selectively formed by epitaxial growth. For generating a tensile strain in the silicon channel region, Si/C may be used instead of SiGe.

FIGS. 1A and 1B show a cross-sectional view, and a top view, respectively of a semiconductor device 100 in an early manufacturing stage. The semiconductor device 100 comprises a semiconductor layer 105 of a first semiconductor material in and/or on which circuit elements, such as transistors, capacitors, resistors, and the like may be formed. The semiconductor layer 105 may be provided on a substrate (not shown), e.g. on a bulk semiconductor substrate or a semiconductor-on-insulator (SOI) substrate, wherein the semiconductor layer 105 may be formed on a buried insulation layer. The semiconductor layer 105 may be a silicon-based crystalline semiconductor layer comprising silicon with a concentration of at least 50%. The semiconductor layer 105 may represent a doped silicon layer as is typically used for highly complex integrated circuits having transistor elements with a gate length around 50 nm or below.

Gate electrodes 110 may be formed above the semiconductor layer 105. The gate electrodes 110 are functional devices, or switching gate electrodes. The gate electrodes 110 may be formed of doped polysilicon or other suitable material which is provided above the semiconductor layer 105 and is separated therefrom by a gate insulation layer 115. The first semiconductor material 105 forms a channel region 120 for a finished transistor. Sidewalls of the gate electrodes 110 may be provided with disposable sidewall spacers (not shown). The disposable sidewall spacers may consist of any appropriate dielectric material, such a silicon nitride, silicon dioxide, or mixtures thereof.

The semiconductor device 100 of FIG. 1A further comprises a cavity or recess defined in the semiconductor layer 105 that is filled with a strained material and doped to define a diffusion region 130. The gate electrode 110 may be used as an etch and growth mask in an etch process and an epitaxial growth process for the formation of the embedded strained semiconductor material. The regions are doped during the growth and/or by implantation to define source and drain regions for the device 100. Silicide contact regions (not shown) may also be defined in a surface portion of the diffusion region 130. Contact elements 135 may be embedded in an interlayer dielectric layer 140 for contacting the underlying diffusion regions 130.

It is common to segregate various regions of the device 100 using isolation structures, as illustrated by an isolation structure 145 defined in the layer 105. Typically, the isolation structure 145 is a trench filled with a dielectric material. To maintain the spacing approximately equal across different regions of the device 100, one or more non-functional gate electrodes 110' may be formed. In FIG. 1B, the gate electrode 110' is formed above the isolation structure 145. The diffusion region 130' laterally abuts the isolation structure 145. The geometry and material of the isolation structure 145 affects the etch and growth processes for forming the embedded strained material, so the diffusion region 130' is reduced in size as compared to the diffusion regions 130 that are defined by adjacent gate electrodes 110. This material loss causes a decrease in performance for the device 100.

One technique for addressing the strained material losses adjacent isolation structures is to partially overlap the non-functional gate electrode structures 110' with the isolation structure 145 so that the etch boundary for forming the diffusion regions 130 is defined by the gate electrode 110' rather than the isolation structure 145. This approach is referred to as a tucked design, and is illustrated by the tucked device 200 shown in the cross-section and top views of FIGS. 2A and 2B.

An issue that arises from a tucked structure is that the gate electrode 110' is partially over the diffusion region 130' of the adjacent transistor structure, rather than being completely over the isolation structure 145. In this arrangement, the gate electrode 110' acts as a floating gate electrode, thereby affecting the operation of the adjacent transistor.

In semiconductor manufacturing, simulation techniques are employed to predict the operation of the designed devices prior to actual fabrication. Device models are used to represent the various devices in a die layout. The models are used to generate performance parameters for the devices and to simulate their operation.

FIG. 3 illustrates a conventional tucked transistor model 300 for the tucked device 200. The model 300 includes a field effect transistor (FET) sub-circuit 305 including a gate bound diode 310, an area diode 315, and a floating gate bound diode 320. A substrate diode 325 is also included as a separate sub-circuit in the model 300. To model the effects of the floating gate electrode 110' an additional floating gate sub-circuit 330 is provided in the model 300. The floating gate sub-circuit 330 includes a first resistor-capacitor (RC) pair including a resistor 335 for modeling gate to diffusion region leakage and a capacitor 340 for modeling gate to diffusion region capacitance. A second RC pair includes a resistor 345 for modeling gate to well leakage and a capacitor 350 for modeling gate to well capacitance.

The floating gate sub-circuit 330 adds complexity to the overall device model 300 by requiring additional components in the netlist. The values for the components of floating gate sub-circuit 330 may be implemented using fixed values, which may be inaccurate, or by using bias-dependent values, which add complexity.

Another limitation of the conventional model 300 shown in FIG. 3 is that in an actual device, the gate bound diode 310 junction capacitance is approximately 5-12 times larger than the STI bound diode 320 junction capacitance. The difference could potentially be further increased due to dopant out-diffusion near the isolation structure 145. The conventional model 300 fails to capture this aspect of the tucked device 200.

This section of this document is intended to introduce various aspects of art that may be related to various aspects of the present subject matter described and/or claimed below. This section provides background information to facilitate a better understanding of the various aspects of the present subject matter. It should be understood that the statements in this section of this document are to be read in this light, and not as admissions of prior art. The present subject matter is directed to overcoming, or at least reducing the effects of, one or more of the problems set forth above.

BRIEF SUMMARY

The following presents a simplified summary of the present subject matter in order to provide a basic understanding of some aspects thereof. This summary is not an exhaustive overview of the present subject matter. It is not intended to identify key or critical elements of the subject matter or to delineate the scope of the subject matter. Its sole purpose is to present some concepts in a simplified form as a prelude to the more detailed description that is discussed later.

One aspect of the present subject matter is seen in a method for simulating a tucked transistor device having a diffusion region defined in a semiconductor layer, a gate electrode adjacent a first side of the diffusion region, a floating gate electrode adjacent a second side of the diffusion region, and an isolation structure disposed beneath at least a portion of the floating gate electrode. The method includes receiving a first netlist having an entry for the tucked transistor device in a computing apparatus. The entry defines parameters associated with the gate electrode and the diffusion region. A parasitic capacitance component is added to the entry representing a gate capacitance between the floating gate and the diffusion region in the computing apparatus.

Another aspect of the present subject matter is seen in a simulation system including a first netlist and a computing apparatus operable to implement a parasitic extraction unit. The first netlist includes a first entry for a tucked transistor device having a diffusion region defined in a semiconductor layer, a gate electrode adjacent a first side of the diffusion region, a floating gate electrode adjacent a second side of the diffusion region, and an isolation structure disposed beneath at least a portion of the floating gate electrode. The first netlist defines parameters associated with the gate electrode and the diffusion region. The parasitic extraction unit is operable to determine a first value of a parasitic capacitance component representing a gate capacitance between the floating gate and the diffusion region and modify the first entry to generate a second entry including the value of parasitic capacitance component to generate a parasitic extraction netlist including the second entry.

BRIEF DESCRIPTION OF THE SEVERAL VIEWS OF THE DRAWINGS

The present subject matter will hereafter be described with reference to the accompanying drawings, wherein like reference numerals denote like elements, and.

Figure 1A:
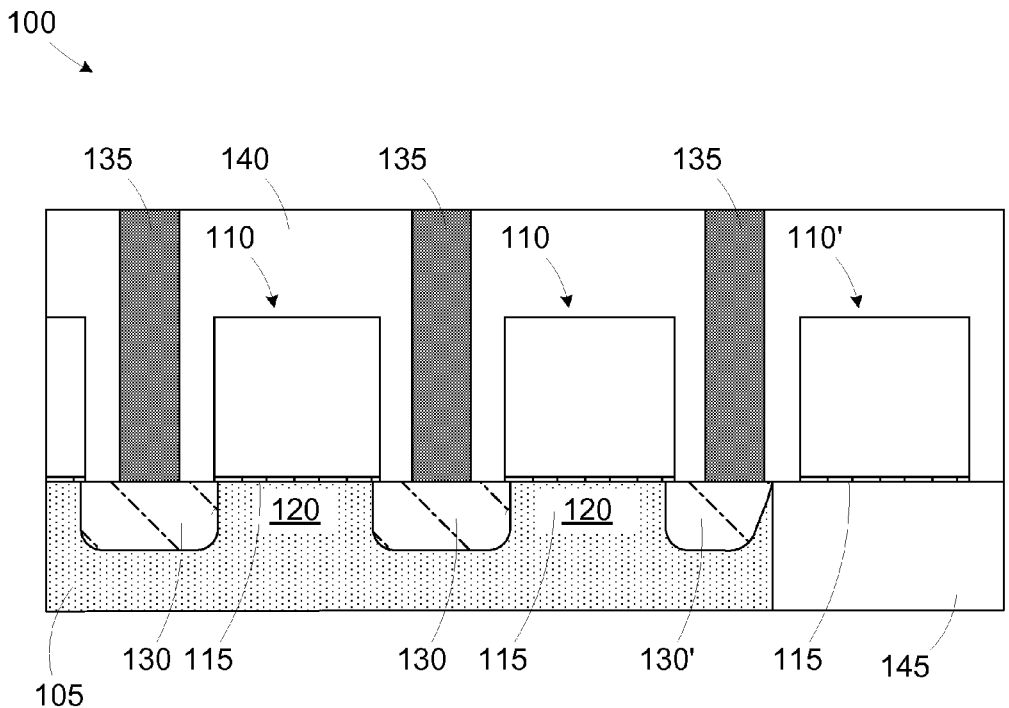
FIGS. 1A and 1B are cross-sectional and top views, respectively of a semiconductor device in an early manufacturing stage.

While the present subject matter is susceptible to various modifications and alternative forms, specific embodiments thereof have been shown by way of example in the drawings and are herein described in detail. It should be understood, however, that the description herein of specific embodiments is not intended to limit the subject matter to the particular forms disclosed, but on the contrary, the intention is to cover all modifications, equivalents, and alternatives falling within the spirit and scope of the present subject matter as defined by the appended claims.

DETAILED DESCRIPTION

One or more specific embodiments of the present subject matter will be described below. It is specifically intended that the present subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present subject matter unless explicitly indicated as being "critical" or "essential."

The present subject matter will now be described with reference to the attached figures. Various structures, systems and devices are schematically depicted in the drawings for purposes of explanation only and so as to not obscure the present subject matter with details that are well known to those skilled in the art. Nevertheless, the attached drawings are included to describe and explain illustrative examples of the present subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 4:
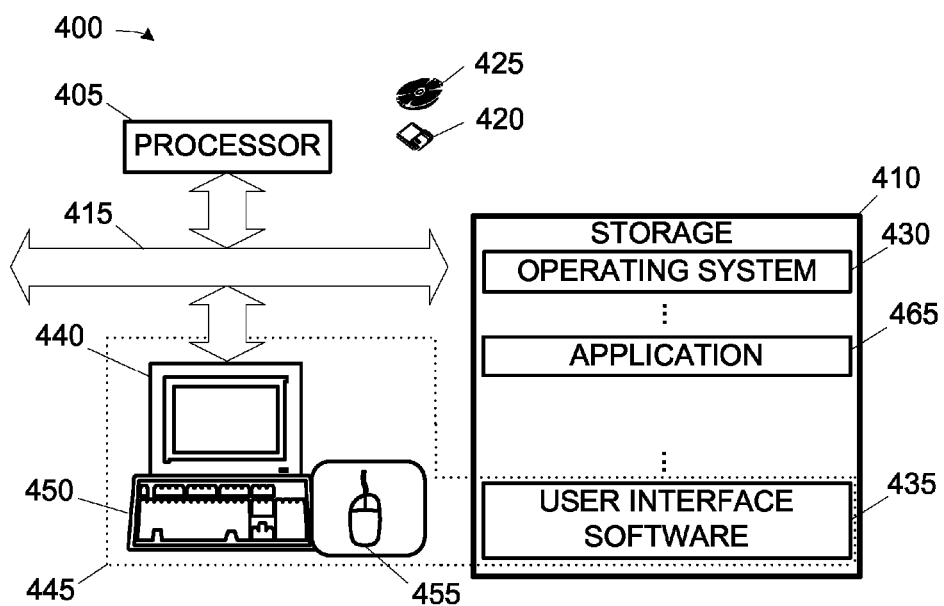
FIG. 4 is a simplified block diagram of a modeling computing apparatus for modeling the performance of semiconductor devices.

Referring now to the drawings wherein like reference numbers correspond to similar components throughout the several views and, specifically, referring to FIG. 4, the present subject matter shall be described in the context of an illustrative modeling computing apparatus 400 for modeling the performance of semiconductor devices. The computing apparatus 400 includes a processor 405 communicating with storage 410 over a bus system 415. The storage 410 may include a hard disk and/or random access memory ("RAM") and/or removable storage, such as a magnetic disk 420 or an optical disk 425. The storage 410 is also encoded with an operating system 430, user interface software 435, and an application 465. The user interface software 435, in conjunction with a display 440, implements a user interface 445. The user interface 445 may include peripheral I/O devices such as a keypad or keyboard 450, mouse 455, etc. The processor 405 runs under the control of the operating system 430, which may be practically any operating system known in the art. The application 465 is invoked by the operating system 430 upon power up, reset, user interaction, etc., depending on the implementation of the operating system 430. The application 465, when invoked, performs a method of the present subject matter. The user may invoke the application 465 in conventional fashion through the user interface 445. Note that although a stand-alone system is illustrated, there is no need for the data to reside on the same computing apparatus 400 as the application 465 by which it is processed. Some embodiments of the present subject matter may therefore be implemented on a distributed computing system with distributed storage and/or processing capabilities.

It is contemplated that, in some embodiments, the application 465 may be executed by the computing apparatus 400 to implement one or more device models and simulation units described hereinafter to model the performance of a transistor as well as any other devices encompassed by the simulation. Data for the simulation may be stored on a computer readable storage device (e.g., storage 410, disks 420, 425, solid state storage, and the like).

Portions of the subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 5:
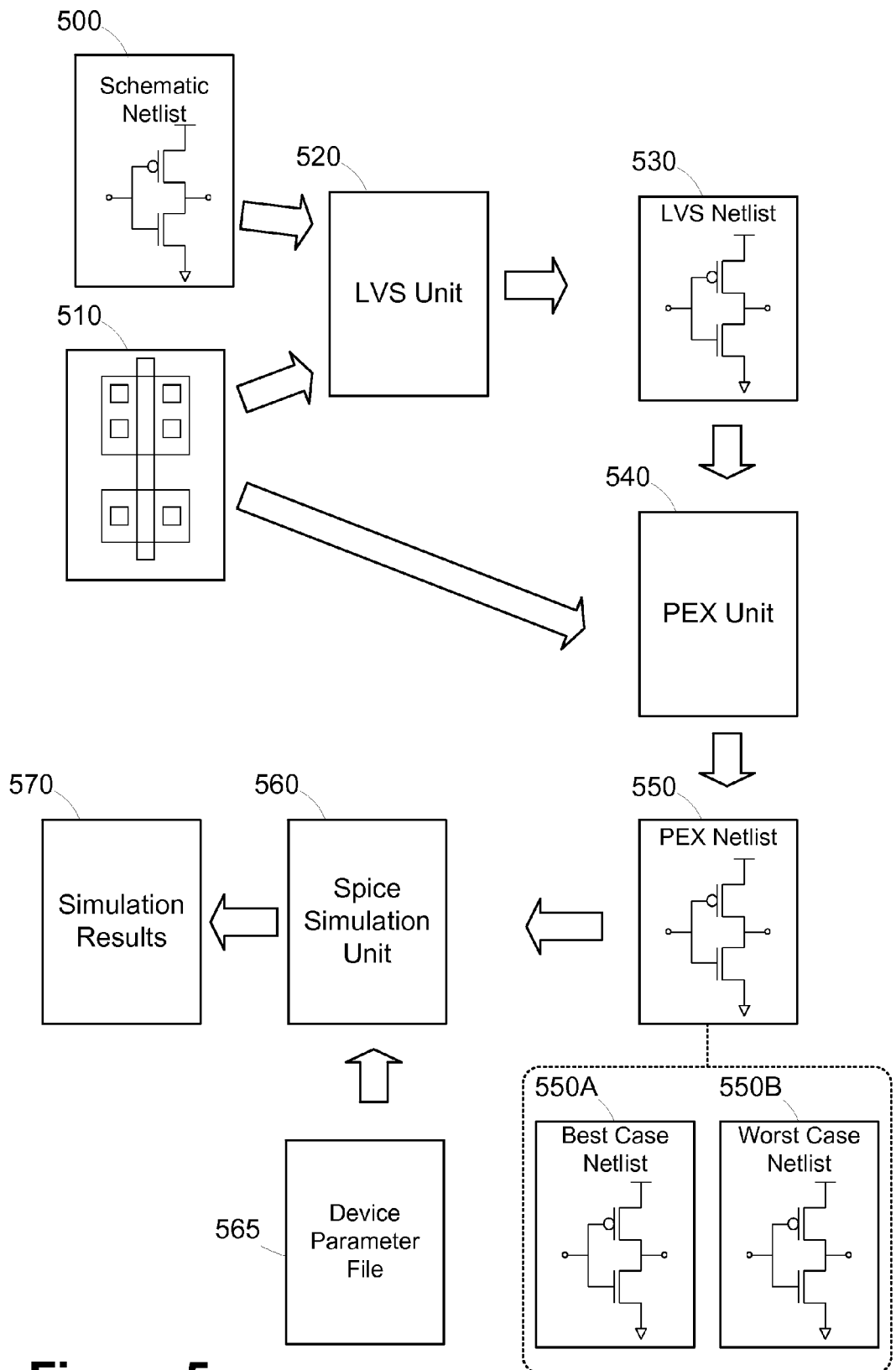
FIG. 5 is a diagram illustrating the operation of the modeling computing apparatus of FIG. 4 for FIG. 6 illustrates a device model of the tucked devices of FIGS. 2A, 2B, and 2C in accordance with the present subject matter.

A general process flow for the computing apparatus 400 in implementing the simulation activities of the application 465 is shown in FIG. 5. Inputs to the application 465 include a schematic netlist 500 that includes base entries defining the discrete devices included in a semiconductor device and a layout file 510 that defines how the devices in the schematic netlist 500 are physically implemented in silicon.

A layout versus schematic (LVS) unit 520 compares the schematic netlist 500 and the layout file 510 to determine whether the integrated circuit layout corresponds to the original schematic of the design. In general, LVS employs equivalence checking, which checks whether two circuits perform the exact same function without demanding exact equivalency. The LVS unit 520 recognizes the drawn shapes of the layout 510 that represent the electrical components of the circuit, as well as the connections between them. The derived electrical components are compared to the schematic netlist 500 to identify errors. The schematic netlist 500 includes basic dimensions for the components, such as width and length, for comparison to the layout file 510. The LVS unit 520 augments the schematic file by modifying the base entries to generate a LVS netlist 530 (i.e., a layout netlist) that includes more detailed measurements, such as drain and source areas and perimeters.

The LVS netlist 530 is provided to a layout parasitic extraction (PEX) unit 540. In general, the LVS netlist 530 includes a group of individual component devices (MOSFETs, bipolar transistors, resistors, capacitors, etc.) connected to build certain functionality. The interconnects (i.e., wiring) between component devices introduce parasitic resistance and capacitance. The PEX unit 540 calculates the amount of parasitic resistance and capacitance of the interconnects based on the layout file 510 using geometry and material parameters (e.g., dielectric constant and resistivity). The PEX unit 540 generates a PEX netlist 550 that includes the parasitic resistance and capacitance corrections to the entries. A simulation unit 560, such as a SPICE (Simulation Program with Integrated Circuit Emphasis) unit, simulates the semiconductor device based on the PEX netlist 550 and a device parameter file 565 to generate simulation results 570. The device parameter file 565 includes material and electrical parameters of the devices identified in the PEX netlist 550. For example, the parameters may include junction capacitance parameters, junction current parameters, threshold mobility, oxide thickness, etc.

The construct and operation of the LVS unit 520, the PEX unit 540, and the simulation unit 560 are known to those of ordinary skill in the art, so they are not described in detail herein, other than to illustrate how the present subject matter deviates from the conventional approach. These units may be implanted in an integrated fashion in the application 465, or they may represent separate software components in a distributed system.

Figure 3:
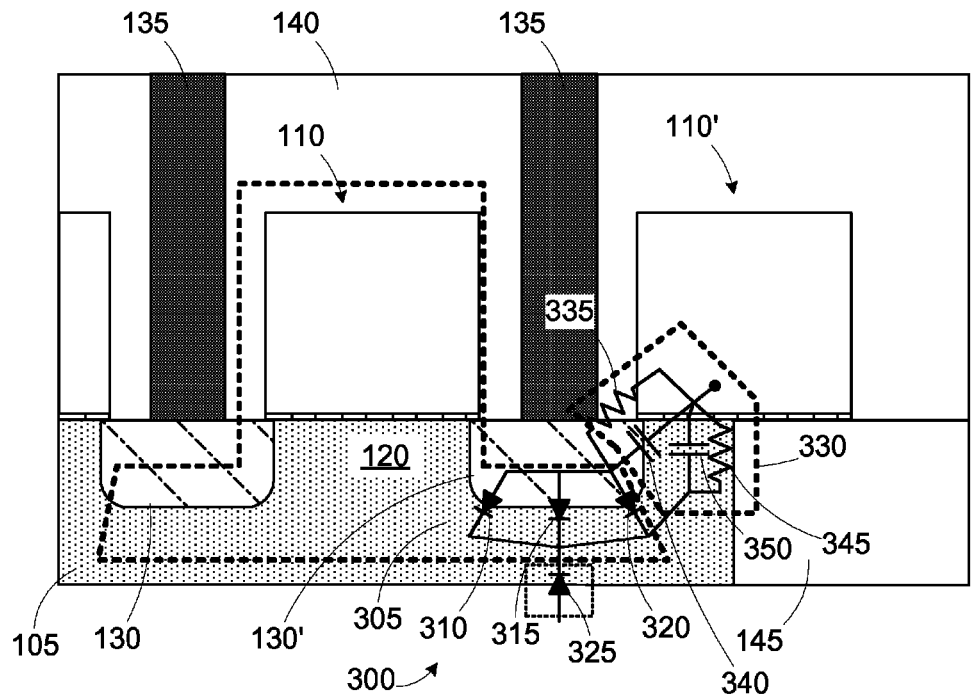
FIG. 3 illustrates a conventional device model of the tucked device of FIGS. 2A and 2B.

In the case of the conventional tucked model of FIG. 3, the schematic netlist 500 would include one entry for the FET sub-circuit 305 and a separate entry for the floating gate sub-circuit 330. Due to the presence of the floating gate sub-circuit 330 in the tucked transistor model 300, the parasitic capacitance evaluation of the PEX unit 540 is suppressed for the tucked devices. This modeling approach for tucked devices adds complexity to the schematic netlist 500 and may introduce inaccuracies associated with the parameter values for the floating gate sub-circuit 330.

Figure 6:
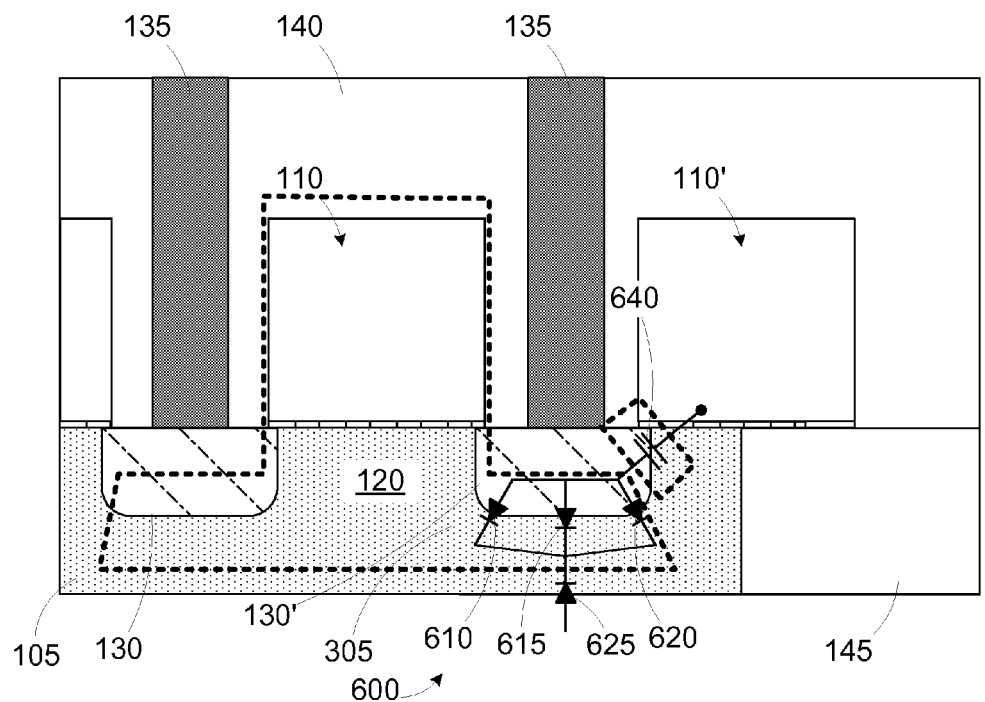

In accordance with the present subject matter, a tucked transistor model 600 shown in FIG. 6 is employed that eliminates the need for the floating gate sub-circuit 330 of FIG. 3. The tucked transistor model 600 includes a gate bound diode 610, an area diode 615, and a floating gate bound diode 620. A substrate diode 625 is modeled as a separate sub-circuit.

Figure 2A:
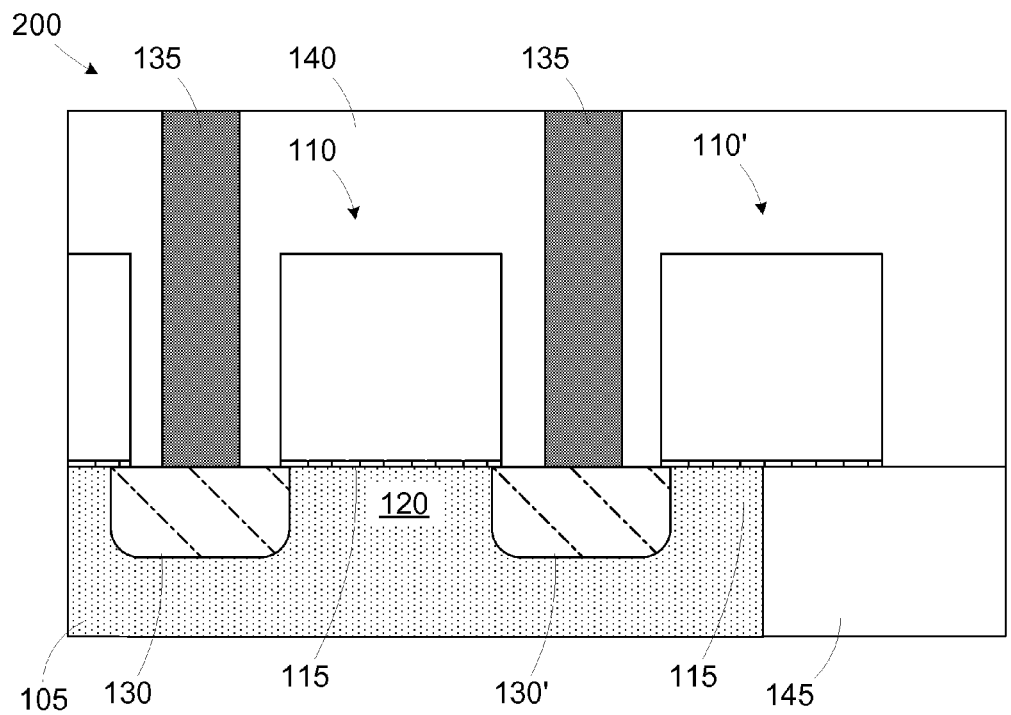
FIGS. 2A and 2B are cross-sectional and top views, respectively of a tucked semiconductor device in an early manufacturing stage.
Figure 7:
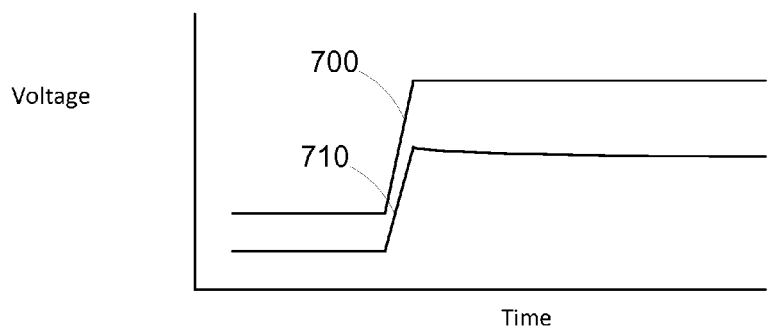
FIG. 7 is a diagram illustrating gate voltage versus time characteristics of the gate and the floating gate in the tucked devices of FIGS. 2A, 2B, and 2C.

The following discussion provides exemplary rational for eliminating the conventional floating gate sub-circuit 330. In general, the voltage across the gate oxide layer 115 of the floating gate electrode 110' of FIG. 2 is only a fraction of the voltage applied to the adjacent functional, or switching gate electrode 110. FIG. 7 illustrates a first voltage curve 700 seen at the switching gate electrode 110 and a second voltage curve 710 seen at the floating gate electrode 110' due to the application of $V_{DD}$ at the device 200. The floating gate sub-circuit 330 causes an RC decay after the step input due to tunneling leakage at the floating gate electrode 110'. However, the time constant RC decay defined by the components of the sub-circuit 330 is in the millisecond range, which is effectively too long to simulate in the simulation unit 560. Hence, the effects of tunneling leakage may be ignored in the model 600 without significantly affecting its performance.

Figure 8:
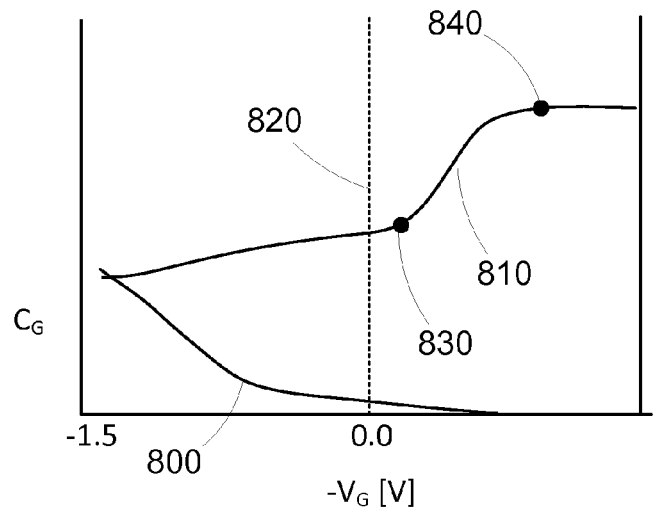
FIG. 8 is a diagram illustrating the gate capacitance as a function of gate voltage for the gate and the floating gate in the tucked devices of FIGS. 2A, 2B, and 2C.

FIG. 8 illustrates the capacitance factors generated by the floating gate electrode 110' as a function of the gate voltage, $-V_G$. The floating gate to well capacitance is shown in curve 800 and the floating gate to diffusion region capacitance is shown in curve 810. The normal operating range of the device 200 is $-V_G > 0$, as represented by the portions of the curves 800, 810 to the right of line 820. In the normal operating range, the floating gate to well capacitance shown in the curve 800 is effectively zero. Hence, in the illustrated embodiment it is ignored in the model 600. The floating gate to diffusion region capacitance shown in the curve 810 exhibits a pseudo-step change as a function of gate voltage.

Figure 9:
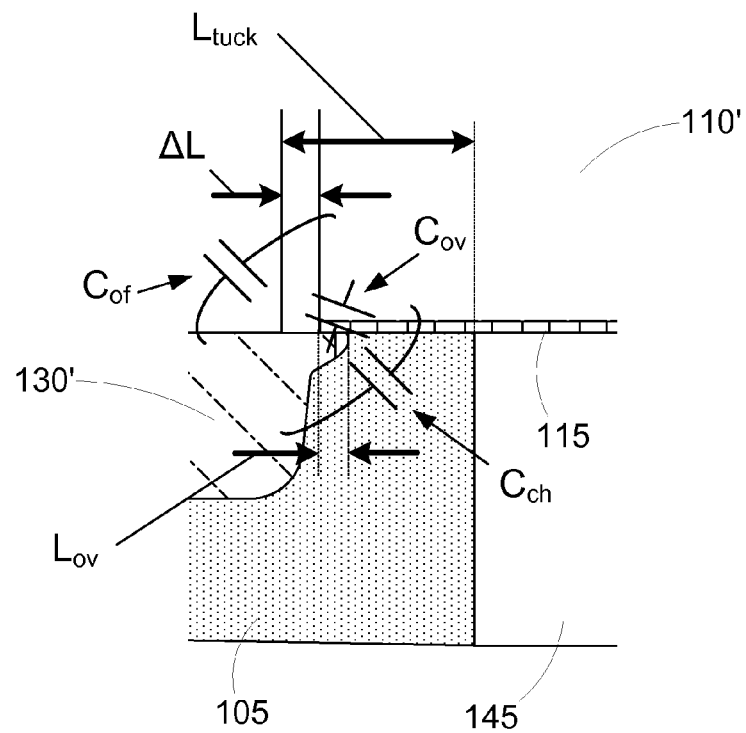
FIG. 9 is a diagram of a portion of the tucked device showing components of the overall gate capacitance in the tucked devices of FIGS. 2A, 2B, and 2C.

The floating gate to diffusion region capacitance is modeled by the PEX unit 540 and is included as a parasitic capacitor component 640 in the tucked transistor model 600 of FIG. 6. The PEX unit 540 employs material information and geometry to define the value for the parasitic capacitor component 640. FIG. 9 illustrates a portion of the device 200 of FIG. 2 to illustrate the capacitive components present due to the geometry of the device 200. There are three components to the overall gate capacitance, $C_G$, including outer fringe capacitance, $C_{of}$, overlap capacitance, $C_{ov}$, and channel capacitance, $C_{ch}$. Geometry parameters of the device 200 that affect capacitance are a tuck length, $L_{tuck}$, representing the degree of tucking between the floating gate electrode 110' and the isolation structure 145, a length variation, $\Delta L$, associated a difference between the design length of the gate and the actual length of the fabricated device, which may vary due to process variation (e.g., lithography, etch, etc.), and an overlap length, $L_{ov}$, representing overlap between the gate electrode portion of the floating gate electrode 110' and the diffusion region 130'. Note that in FIG. 9, a portion of the diffusion region 130' extends beneath the gate electrode portion. This effect may result from undercutting during the etch process to form the recesses and/or dopant diffusion.

Figure 10:
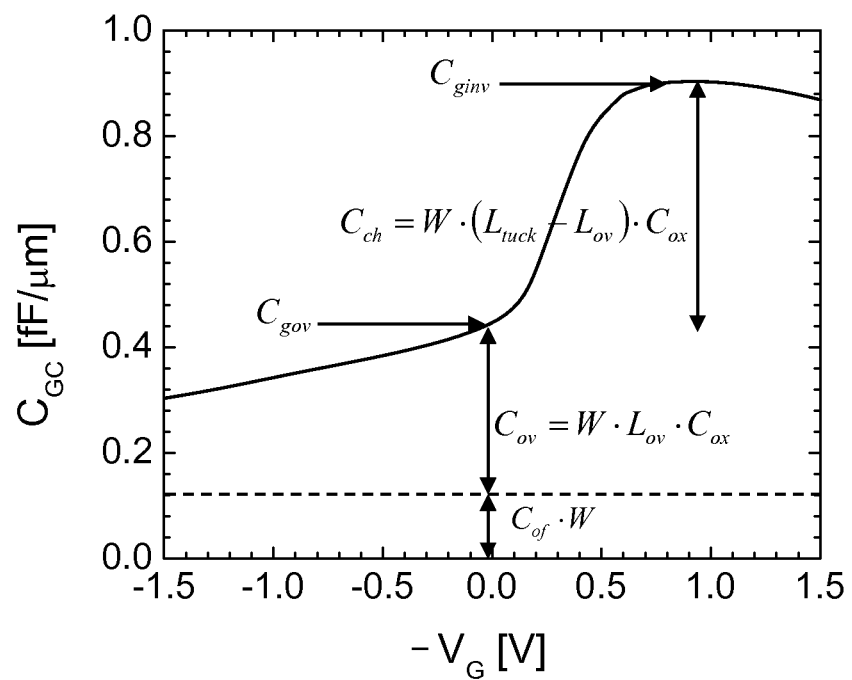
FIG. 10 is a diagram of the components of the overall gate capacitance in the device of FIG. 9 as a function of gate voltage.

FIG. 10 illustrates how the capacitive components cooperate to generate the overall capacitance of the floating gate electrode 110'. The outer fringe capacitance, $C_{of}$, is proportional to the width, W, of the floating gate electrode 110' (i.e., in the direction perpendicular to the page in FIG. 2a). Outer fringe capacitance is typically determined using a simulated result by solving a Maxwell equation (i.e., capacitance calculation between arbitrary shapes of conductors). In the illustrated embodiment, values for outer fringe capacitance are generated by the PEX unit 540 using a look-up table or analytical model.

The overlap capacitance, $C_{ov}$, is proportional to the width, W, the overlap length, $L_{ov}$, and the capacitance of the gate oxide layer 115, $C_{ox}$ (i.e., based on its permittivity and thickness), as is defined by the equation:

$$C_{ox}=W \cdot L_{ov} \cdot C_{ox}.$$

The channel capacitance, $C_{ch}$, is proportional to the width, W, the difference between the tuck length, $L_{tuck}$, and the overlap length, $L_{ov}$, and the gate oxide capacitance, $C_{ox}$, as is defined by the equation:

$$C_{ch}=W \cdot (L_{tuck}-L_{ov}) \cdot C_{ox}.$$

As seen in FIG. 10, a minimum capacitance at the start of the operating range is defined by a gate overlap capacitance, $C_{gov}$, which is given by the equation:

$$C_{gov}=W[L_{ov}C_{ox}+C_{of}]=C_{min}.$$

The maximum capacitance over the operating range is defined by a gate inverted channel capacitance, $C_{ginv}$, which is given by the equation:

$$C_{ginv}=C_{gov}+C_{ch}=W \cdot [(L_{tuck}-\Delta L)C_{ox}+C_{of}]=C_{max}$$

In one embodiment, the PEX unit 540 may also address overlay issues that affect the gate capacitance. Overlay shift, $L_{OLS}$, can introduce significant variation. The equations for best and worst case capacitance may be adjusted for overlay shift by using the following equations.

$$C_{max}=W \cdot [(L_{tuck}-\Delta L+L_{OLS})C_{ox}+C_{of}] \text{ and}$$

$$C_{min}=W[\min(L_{tuck}-L_{OLS},L_{ov})C_{ox}+C_{of}].$$

Figure 2B:
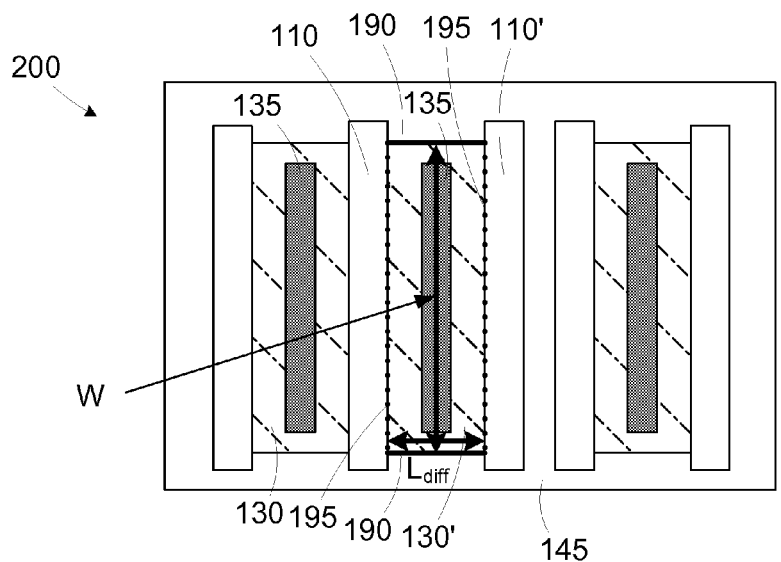
Figure 2C:
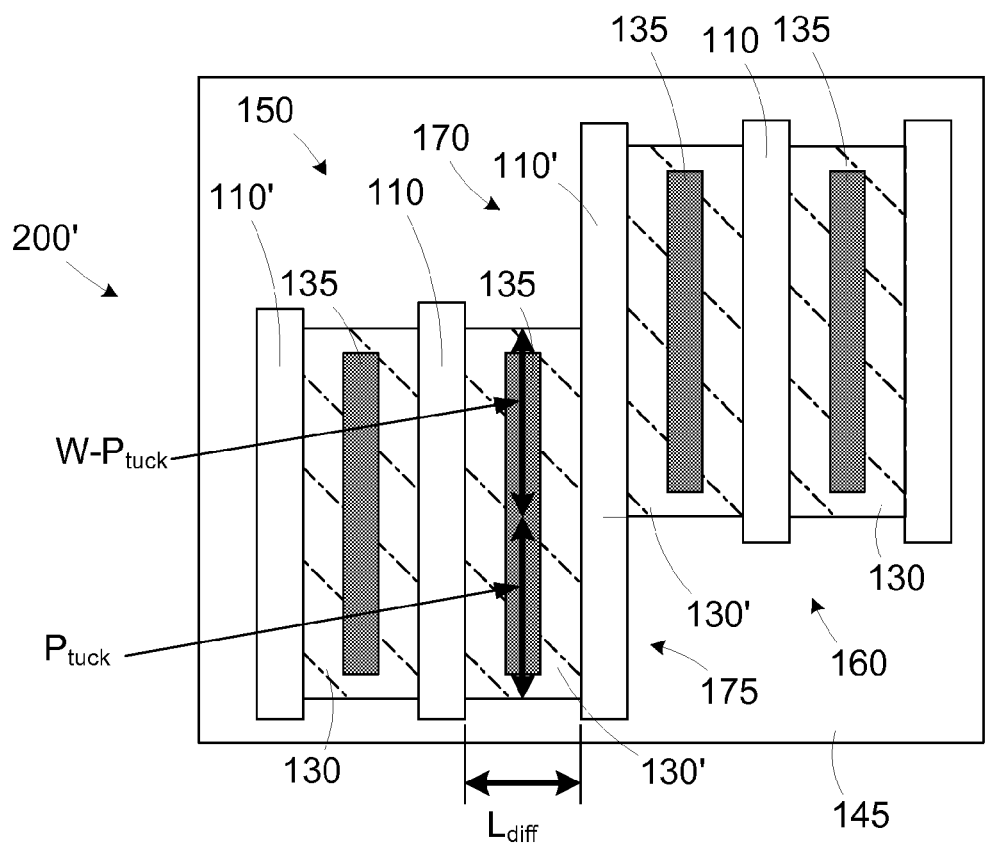
FIG. 2C is a top view of a shared floating gate tucked device.

Turning to FIG. 2C, a tucked device 200' is illustrated where the floating gate electrode 110' is shared by two adjacent devices 150, 160. Note that the floating gate effects are limited to the regions 170 and 175 where the devices 150, 160 do not overlap. For such devices, there are portions where the gate electrode 110' does not overlap the isolation structure 145. In these cases, the values of $\Delta L$ and $L_{ov}$ are doubled.

Returning to FIG. 5, rather than dynamically modeling the overall capacitance as a function of voltage, the PEX unit 540 generates a best case netlist 550A using $C_{min}$ and a worst case netlist 550B using $C_{max}$. The simulation unit 560 may then generate the simulation results 570 having separate analysis for each netlist 550A, 550B.

Implementing the modeling of the gate capacitance of the tucked device as described herein requires a smaller number of components in the netlist than the conventional implementation for a tucked device. The gate capacitance factor is incorporated into the parasitic capacitance of the device, thereby avoiding the need for an additional model component. As a result, there is no change in the number of components in the netlist as compared to the non-tucked case, and the netlist is consistent with schematic. The modeling approach provides an accurate gate capacitance assessment without requiring a voltage dependent equation, thereby improving computational efficiency. The approach may also be expanded to consider the impact of overlay shift.

In another embodiment of the present subject matter, the model 600 is adjusted to add a correction factor for the junction capacitance difference between the gate bound diode 610 and the floating gate bound diode 620. Rather than ignoring this difference or adding an additional component in the schematic netlist 500 to address this difference, the effect is captured by modifying the diode parameters in the model 600 for the device 200.

Figure 1B:
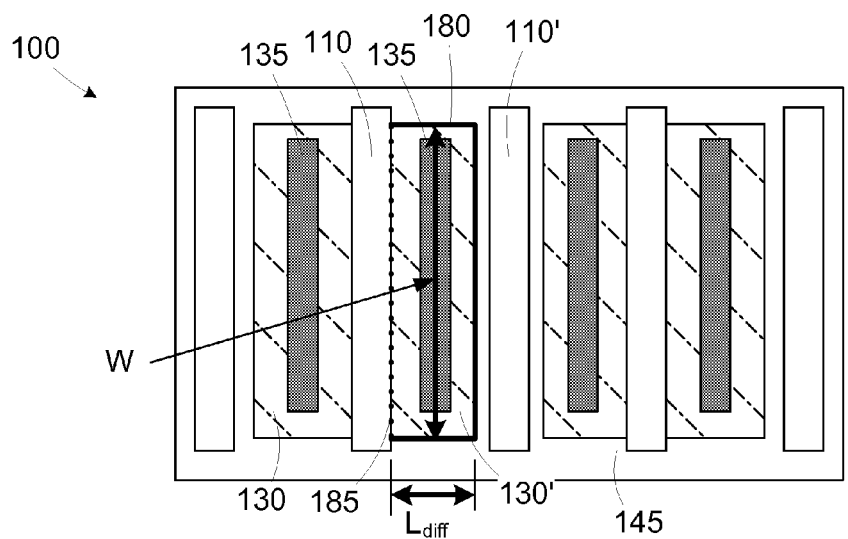

Referring to FIGS. 1B, 2B, and 2C the length and width of the diffusion region, $L_{diff}$, W are shown. In the LVS netlist 530 shown in FIG. 5, the LVS unit 520 determines values for the area and perimeter of the source and drain regions of the diffusion regions. For the untucked device, as shown in FIG. 1A the perimeters and areas of the source and drain are:

$$PS=PD=2 \cdot L_{diff}+W, \text{ and}$$

$$AS=AD=W \cdot L_{diff}.$$

In the model 300, the total junction capacitance for the drain is:

$$C_{jD,Total}=C_{area}AD+C_{STI}PD+C_{gate} \cdot W.$$

The perimeter component is illustrated by a perimeter line 180 in FIG. 1B, and the gate component is delineated by a gate line 185.

For the tucked device 200, and the shared tucked device 200', due to the overlap between the floating gate electrode 110' with the diffusion region 130', the perimeters and areas are:

$$PS=PD=2 \cdot L_{diff}, \text{ and}$$

$$AS=AD=W \cdot L_{diff}.$$

In the model 600, the total junction capacitance for the drain is:

$$C_{jD,Total}=C_{area}AD+C_{STI}PD+C_{gate} \cdot 2W.$$

The perimeter component is illustrated by a perimeter line 190 in FIG. 2B, and the gate component is delineated by a gate line 195. The gate component is effectively doubled due to the overlap with both the gate electrode 110 and the floating gate electrode 110', as shown by the gate lines 195. Although the gate-bound diode component is effectively doubled, the modeling system does not allow the W parameter to be modified to reflect this difference, as the W parameter is generated automatically by the LVS unit 520. Adding the extra gate-bound diode capacitance component would require an additional component in the schematic netlist 500.

The multiple of 2 for the $C_{gate}$ parameter assumes that the junction capacitance at the gate side is the same as that at the floating gate side. However, in an actual device, the junction capacitances differ significantly, as described above. To incorporate the differences in junction capacitance, the $C_{gate}$ parameter is multiplied by a variable factor as indicated in the equation:

$$C_{gate} = C_{gate0} \cdot (1 + M_{Tuck}),$$

where $M_{tuck}$ represents the ratio of junction capacitance at the gate side to the junction capacitance at the floating gate side.

Adjusting the $C_{gate}$ parameter results in a total junction capacitance of:

$$C_{jD,Total} = C_{area} AD + C_{STI} \cdot PD + C_{gate0} \cdot (1 + M_{Tuck}) \cdot W.$$

For the shared floating gate arrangement shown in FIG. 2C, the $$C_{gate} = C_{gate0} \cdot \left[ 1 + \frac{W - P_{tuck}}{W} + \frac{P_{tuck}}{W} M_{Tuck} \right]$$

Typically, the junction capacitance parameters are hard-coded in the device parameter file 565 that is provided to the SPICE simulation unit 560 with the PEX netlist 550. In accordance with an embodiment of the present subject matter, the hard-coding in the device parameter file 565 is modified for the tucked device 200 to incorporate the additional capacitance directly in the $C_{gate}$ parameter. Incorporating the adjustment factor into the $C_{gate}$ parameter rather than the W parameter allows the conventional untucked model to be used and avoids the need for an extra component in the schematic netlist 500. The device parameter file 565 may be modified automatically by a software unit or manually by the individual specifying the simulation parameters.

The particular embodiments disclosed above are illustrative only, as the subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the subject matter. Accordingly, the protection sought herein is as set forth in the claims below.

We claim:

1. A method for simulating a tucked transistor device having a diffusion region defined in a semiconductor layer, a gate electrode adjacent a first side of the diffusion region, a floating gate electrode adjacent a second side of the diffusion region, and an isolation structure disposed beneath at least a portion of the floating gate electrode, comprising:

receiving a first netlist having an entry for the tucked transistor device in a computing apparatus, the entry defining parameters associated with the gate electrode and the diffusion region; and adding a parasitic capacitance component to the entry in the computing apparatus, the parasitic capacitance component representing a gate capacitance between the floating gate and the diffusion region, wherein adding the parasitic capacitance component comprises generating a first value for the parasitic capacitance component based on a first capacitance of the floating gate electrode present in an initial portion of an operating range of the tucked transistor device and generating a second value for the parasitic capacitance component based on a capacitance of the floating gate electrode present in an inversion region of an operating range of the tucked transistor device;

generating the first netlist based on the first value;

generating a second netlist based on the second value;

simulating operation of the tucked transistor device using a transistor device model and the first netlist to generate a first simulation result; and simulating operation of the tucked transistor device using the transistor device model and the second netlist to generate a second simulation result.

2. The method of claim 1 wherein the tucked transistor device further comprises a gate insulation layer disposed between the semiconductor layer and the floating gate electrode, and the first value of the parasitic capacitance component comprises a sum of an outer fringe capacitance of an interface between the floating gate electrode and the diffusion region and an overlap capacitance of an interface between the floating gate electrode, the gate dielectric layer, and a portion of the diffusion region beneath the floating gate electrode.

3. The method of claim 1, wherein the tucked transistor device further comprises a gate insulation layer disposed between the semiconductor layer and the floating gate electrode, and the second value of the parasitic capacitance component comprises a sum of:

an outer fringe capacitance of an interface between the floating gate electrode and the diffusion region;

an overlap capacitance of an interface between the floating gate electrode, the gate dielectric layer, and a first portion of the diffusion region beneath the floating gate electrode; and a channel capacitance of an interface between the floating gate electrode, the gate dielectric layer, and a second portion of the diffusion region not disposed beneath the floating gate electrode.

4. The method of claim 1, wherein the computing apparatus is operable to implement a parasitic extraction unit, and the method further comprises:

determining a value of the parasitic capacitance component in the parasitic extraction unit; and modifying the entry to include the value of parasitic capacitance component in the parasitic extraction unit to generate a second netlist including the modified entry.

5. The method of claim 4, wherein the first netlist comprises a schematic netlist.

6. The method of claim 1, wherein the computing apparatus is operable to implement a layout versus schematic unit and parasitic extraction unit, the first netlist comprises a schematic netlist, and the method further comprises:

receiving a layout file defining physical features of the tucked transistor device;

modifying the first entry in the schematic netlist based on the layout file using the layout versus schematic unit to generate a second entry including dimensional parameters to generate a layout netlist including the second entry; and determining a value of the parasitic capacitance component using the parasitic extraction unit and modifying the second entry in the layout netlist to generate a third entry including the value of parasitic capacitance component to generate a parasitic extraction netlist including the third entry.

7. A method for simulating a tucked transistor device having a diffusion region defined in a semiconductor layer, a gate electrode adjacent a first side of the diffusion region, a floating gate electrode adjacent a second side of the diffusion region, and an isolation structure disposed beneath at least a portion of the floating gate electrode, comprising:

receiving a first netlist having an entry for the tucked transistor device in a computing apparatus, the entry defining parameters associated with the gate electrode and the diffusion region; and adding a parasitic capacitance component to the entry in the computing apparatus, the parasitic capacitance component representing a gate capacitance between the floating gate and the diffusion region, wherein adding the parasitic capacitance component comprises generating a value for the parasitic capacitance component based on a capacitance of the floating gate electrode present in an inversion region of an operating range of the tucked transistor device; and simulating operation of the tucked transistor device in the computing apparatus using a transistor device model and the first netlist.

8. The method of claim 7, wherein the tucked transistor device further comprises a gate insulation layer disposed between the semiconductor layer and the floating gate electrode, and the value of the parasitic capacitance component comprises a sum of:

an outer fringe capacitance of an interface between the floating gate electrode and the diffusion region;

an overlap capacitance of an interface between the floating gate electrode, the gate dielectric layer, and a first portion of the diffusion region beneath the floating gate electrode; and a channel capacitance of an interface between the floating gate electrode, the gate dielectric layer, and a second portion of the diffusion region not disposed beneath the floating gate electrode.

9. The method of claim 7, wherein the computing apparatus is operable to implement a parasitic extraction unit, and the method further comprises:

determining a value of the parasitic capacitance component in the parasitic extraction unit; and modifying the entry to include the value of parasitic capacitance component in the parasitic extraction unit to generate a second netlist including the modified entry.

10. The method of claim 9, wherein the first netlist comprises a schematic netlist.

11. The method of claim 10, wherein the computing apparatus is operable to implement a layout versus schematic unit and parasitic extraction unit, the first netlist comprises a schematic netlist, and the method further comprises:

receiving a layout file defining physical features of the tucked transistor device;

modifying the first entry in the schematic netlist based on the layout file using the layout versus schematic unit to generate a second entry including dimensional parameters to generate a layout netlist including the second entry; and determining a value of the parasitic capacitance component using the parasitic extraction unit and modifying the second entry in the layout netlist to generate a third entry including the value of parasitic capacitance component to generate a parasitic extraction netlist including the third entry.

* * * * *